United States Patent
Adetutu et al.

(10) Patent No.: US 7,432,164 B2
(45) Date of Patent: Oct. 7, 2008

(54) SEMICONDUCTOR DEVICE COMPRISING A TRANSISTOR HAVING A COUNTER-DOPED CHANNEL REGION AND METHOD FOR FORMING THE SAME

(75) Inventors: Olubunmi O. Adetutu, Austin, TX (US); David C. Gilmer, Austin, TX (US); Philip J. Tobin, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 248 days.

(21) Appl. No.: 11/342,025

(22) Filed: Jan. 27, 2006

(65) Prior Publication Data

US 2007/0178633 A1    Aug. 2, 2007

(51) Int. Cl.
*H01L 21/8236* (2006.01)
*H01L 21/336* (2006.01)
*H01L 21/8234* (2006.01)

(52) U.S. Cl. ............. 438/276; 438/289; 438/290; 438/275; 257/E29.16; 257/E21.151; 257/E21.623

(58) Field of Classification Search ............ 257/E21.12, 257/E21.168, E21.148, E21.15, E21.151; 438/289–291, 553, 592, 276
See application file for complete search history.

(56) References Cited

U.S. PATENT DOCUMENTS

| | | | | |
|---|---|---|---|---|
| 5,086,016 A | * | 2/1992 | Brodsky et al. | ............. 438/369 |
| 5,571,744 A | * | 11/1996 | Demirlioglu et al. | ........ 438/217 |
| 5,918,129 A | * | 6/1999 | Fulford et al. | ............. 438/289 |
| 6,171,895 B1 | * | 1/2001 | Chou et al. | ................. 438/217 |
| 6,262,461 B1 | | 7/2001 | Marshall et al. | |
| 6,472,278 B1 | | 10/2002 | Marshall et al. | |
| 6,713,334 B2 | * | 3/2004 | Nandakumar et al. | ....... 438/199 |
| 6,770,521 B2 | | 8/2004 | Visokay et al. | |
| 6,897,095 B1 | | 5/2005 | Adetutu et al. | |

(Continued)

OTHER PUBLICATIONS

Polishschuck et al; "Dual Work Function Metal Gate CMOS Transistors by Ni-Ti Interdiffusion"; Electron Device Letters, IEEE vol. 23, Issue 4, Apr. 2002 pp. 200-202.

(Continued)

*Primary Examiner*—Carl Whitehead, Jr.
*Assistant Examiner*—Daniel Luke
(74) *Attorney, Agent, or Firm*—Daniel D. Hill; Ranjeev K. Singh

(57) ABSTRACT

A method for making a semiconductor device includes providing a first substrate region and a second substrate region, wherein at least a part of the first substrate region has a first conductivity type and at least a part of the second substrate region has a second conductivity type different from the first conductivity type. The method further includes forming a dielectric layer over at least a portion of the first substrate region and at least a portion of the second substrate region. The method further includes forming a metal-containing gate layer over at least a portion of the dielectric layer overlying the first substrate region. The method further includes introducing dopants into at least a portion of the first substrate region through the metal-containing gate layer.

17 Claims, 3 Drawing Sheets

U.S. PATENT DOCUMENTS

| | | | |
|---|---|---|---|
| 6,902,969 B2 | 6/2005 | Adetutu et al. | |
| 6,972,224 B2 | 12/2005 | Gilmer et al. | |
| 2004/0023478 A1* | 2/2004 | Samavedam et al. | 438/592 |
| 2004/0065930 A1 | 4/2004 | Lin et al. | |
| 2004/0175910 A1 | 9/2004 | Pan et al. | |
| 2004/0262700 A1* | 12/2004 | Ahn et al. | 257/410 |
| 2005/0048722 A1* | 3/2005 | Saito et al. | 438/275 |

OTHER PUBLICATIONS

Ha et al; "Molybdenum Gate work Function Engineering for Ultra-Thin-Body Silicon-on-Insulator (UTB SOI) MOSFET s"; Jpn. J. Appl. Phys. vol. 42 (2003) pp. 1979-1982, Part I No. 4B, Apr. 2003.

Ranade et al; "Work Function Engineering of Molybdenum Gate Electrodes by Nitrogen Implantation"; Electrochemical and Solid-State Letters, 4 (11) pp. G85-G87; 2001.

* cited by examiner

SEMICONDUCTOR DEVICE COMPRISING A TRANSISTOR HAVING A COUNTER-DOPED CHANNEL REGION AND METHOD FOR FORMING THE SAME

FIELD OF THE DISCLOSURE

The present disclosure relates to semiconductor devices, and more particularly to a semiconductor device comprising a metal gate electrode and a counter-doped channel and method for forming the same.

DESCRIPTION OF THE RELATED ART

State-of-the-art semiconductor devices currently include transistors having a gate dielectric layer formed from one or more high dielectric constant ("high-k") materials. These materials typically have a dielectric constant higher than that of silicon dioxide, which is approximately 3.9. High-k dielectric materials, including $HfO_2$, $ZrO_2$, etc., are used as gate dielectric layers in transistors that have metal gate electrodes instead of polysilicon gate electrodes due to the potential problems with poly depletion in doped polysilicon gates. Exemplary materials for metal gate electrodes include TiN, TaC, TaSiN, and the like.

When a metal gate electrode is used, the portion of metal gate electrode closest to the gate dielectric layer establishes the work function for the gate electrode. Changing the work function metal gate electrode will also change the threshold voltage ($V_T$). An NMOS (N-type metal-oxide semiconductor) transistor may have TaSiN as the portion of its metal-containing gate electrode closest to the high-k gate dielectric layer, and a PMOS (P-type metal-oxide semiconductor) transistor may have TiN as the portion of its metal-containing gate electrode closest to the high-k gate dielectric layer. The work function for TaSiN is about 4.3 eV, and the work function for TiN is about 4.6 eV. As a basis for comparison, the work function for $N^+$ silicon and the energy level for the conduction band ("$E_c$") for silicon is 4.1 eV, and the work function for $P^+$ silicon and the energy level for the valence band ("$E_v$") for silicon is 5.2 eV. Therefore, the difference between $E_c$ and the work function for TaSiN is 0.2 eV, and the difference between $E_v$ and the work function for TiN is 0.6 eV. These differences can cause longer times to switch states (i.e., "on" and "off") for the transistors, and therefore, result in a slower operating electronic device. Also, the work function for a metal gate electrode can be "pinned" towards mid-band, limiting the ability to change the $V_T$.

Therefore, there is a need to be able to modulate the $V_T$ for metal gate transistors.

BRIEF DESCRIPTION OF THE DRAWINGS

The invention is illustrated by way of example and not limitation in the accompanying figures.

Figure 1:
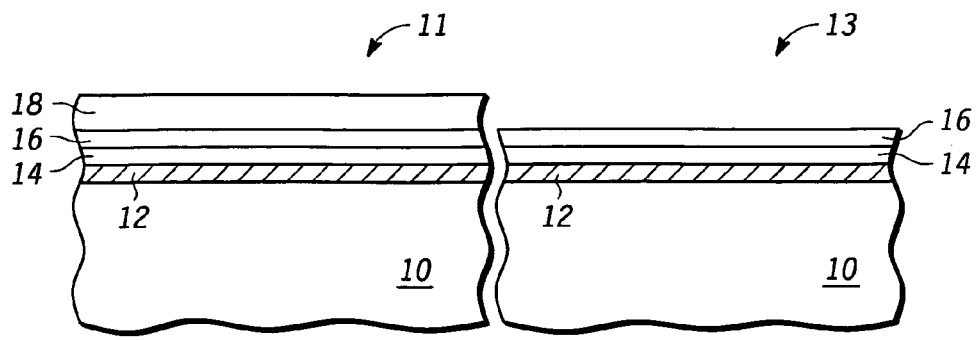
FIG. 1 includes an illustration of cross-sectional views of portions of a semiconductor device substrate after forming a plurality of layers for part of a gate electrode stack.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

One or more impurities may be incorporated within the channel region of a transistor having a metal-containing gate electrode to modify the threshold voltage of the transistor. In a particular embodiment, a boron-containing species is implanted into a channel region below the metal-containing gate electrode within a transistor.

In one embodiment, the boron-containing species includes B or $BF_2$. In a particular embodiment, the first layer includes an elemental transition metal, a transition metal nitride, a transition metal silicon nitride, or any combination thereof.

Before addressing details of embodiments described below, some terms are defined or clarified. Group numbers corresponding to columns within the Periodic Table of the elements use the "New Notation" convention as seen in the *CRC Handbook of Chemistry and Physics,* 81$^{st}$ Edition (2000).

The term "metal" or any of its variants is intended to refer to a material that includes an element that is within any of Groups 1 to 12, within Groups 13 to 16, an element that is along and below a diagonal line defined by atomic numbers 13 (Al), 32 (Ge), 51 (Sb), and 84 (Po), or any combination thereof. Metal does not include Si. The term "transition metal element" is intended to refer to an element that is within any of Groups 3 to 12.

The term "elemental transition metal" is intended to refer to a transition metal that is not part of a molecule that comprises at least two different elements. For example, Ti atoms that are not chemically bound to any other atoms are considered an elemental transition metal; however Ti atoms within TiN are not considered to be an elemental transition metal.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

FIG. 1 includes an illustration of a cross-sectional view of a substrate 10, which includes a PMOS portion 11 and an NMOS portion 13. The substrate 10 can include a monocrystalline semiconductor material, a semiconductor-on-insulator substrate, or nearly any other substrate used in forming semiconductor devices. Within the PMOS portion 11, the substrate 10 may include an n-type dopant, and within the NMOS portion 13, the substrate 10 may include a p-type dopant. In another embodiment, the conductivity types for the dopants may be reversed or may be the same.

Layers are sequentially formed over the substrate 10 within the PMOS and NMOS portions 11 and 13. The layers include a gate dielectric layer 12, a first layer 14, which will the part of the gate electrode within PMOS portion 11, and a hard mask layer 16. The gate dielectric layer 12 has a thickness in a range of approximately 1 to 5 nm, the first layer has a thickness in a range of approximately 5 to 20 nm, and the hard mask layer 16 has a thickness in a range of approximately 10 to 100 nm. Although not illustrated, an interfacial layer of approximately 1 nm may be formed between the substrate 10 and the gate dielectric layer 12 during or prior to the formation of the electronic device.

The gate dielectric layer 12 can include one or more high-k materials, such as $HfO_2$. In another embodiment, the gate dielectric layer 12 can include $HfO_xN_y$, $HfSi_xO_y$, $HfSi_xO_yN_z$, $HfZr_xO_yN_z$, $HfZr_xSi_yO_zN_q$, $HfZrO$, $ZrSi_xO_y$, $ZrSi_xO_yN_z$, $ZrO_2$, other Hf-containing or Zr-containing dielectric material, or any combination thereof. The first layer 14 is compatible with the gate dielectric layer 12 (i.e., does not adversely interact with the gate dielectric layer 12). In one embodiment, the first layer 14 includes a metallic element, such as a transition metal element. In a particular embodiment, the first layer 14 includes an elemental transition metal (e.g., substantially only atoms of the transition metal). In another embodiment, the first layer 14 may include a second element that, in one embodiment, is any element other than silicon. The first layer may include a third element. The third element may include silicon. Therefore, the first layer 14 can include only one element that is a metallic element, can include only two elements, wherein both of the elements are not silicon, or can include three or more elements, of which, one of the elements may be silicon. The first layer 14 can include TiN, $Mo_xN_y$, TaC, $MoSi_xN_y$, $RuO_2$, $IrO_2$, Ru, Ir, MoSiO, MoSiON, MoHfO, MoHfON, other transition metal containing material, or any combination thereof.

The hard mask layer 16 can include nearly any material that is relatively resistant to etching when portions of the first layer 14 are to be removed. Additionally, when the hard mask layer 16 is subsequently removed after patterning the first layer 14, the hard mask layer 16 will be removed selectively to a remaining portion of the first layer 14. The hard mask layer 16 can include $SiO_2$, $Si_3N_4$, $SiO_xN_y$, or any combination thereof. In one embodiment, the hard mask layer 16 is formed by depositing an oxide layer using tetraethylorthosilicate (TEOS).

The gate dielectric layer 12, first layer 14, hard mask layer 16, or any combination thereof can be formed by depositing an appropriate material using atomic layer deposition, chemical vapor deposition, physical vapor deposition, or the like. In another embodiment, the gate dielectric layer 12, first layer 14, hard mask layer 16, or any combination thereof can include one film or a plurality of films.

A resist layer is formed over the substrate 10 and is patterned to form a resist mask 18, which overlies the hard mask layer 16 within the PMOS portion 11. The resist mask 18 is not formed over the hard mask layer 16 within the NMOS portion 13. In one embodiment, the resist mask 18 is formed by coating or otherwise depositing a photoresist material to form the resist layer, and using a lithographic process to pattern the resist layer to form the resist mask 18. The resist layer may include a negative-acting or positive-acting photoresist material.

Figure 2:
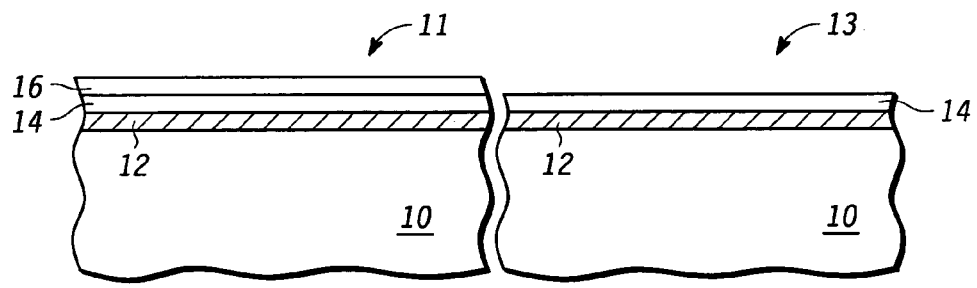
FIG. 2 includes an illustration of cross-sectional views of the portions of the substrate in FIG. 1 after removing a portion of a hard mask layer and a resist mask.

The exposed portion of the hard mask layer 16 is removed from the NMOS portion 13, and the resist mask 18 is then subsequently removed, as illustrated in FIG. 2. The hard mask layer 16 may be removed by using a conventional etching process. The etching is performed such that the hard mask layer 16 is selectively removed as compared to the first layer 14. In one embodiment, etching can be preformed as a wet etch using a dilute HF solution. In one embodiment, the dilute HF solution has at least 10 parts H2O for each part HF, and in a particular embodiment, the dilute HF solution has at least 100 parts H2O for each part HF. In another embodiment, etching can be performed as a dry etch. The resist mask 18 is removed using a conventional ashing technique.

At this point in the process, a remaining portion of the hard mask layer 16 lies within the PMOS portion 11, and a portion of the first layer 14 is exposed within the NMOS portion 13. The exposed portion of the first layer 14 is removed from the NMOS portion 13. The hard mask layer 16 protects the portion of the first layer 14 within the PMOS portion 11, such that it is not removed. The first layer 14 may be removed by using a conventional etching process. The etching is performed such that the first layer 14 is selectively removed as compared to the hard mask layer 16. In one embodiment, etching can be performed as a wet etch using a diluted NH4OH solution. In one embodiment, the diluted NH4OH solution has at least 10 parts H2O and H2O2 for each part NH4OH, and in a particular embodiment, the diluted NH4OH solution has at least 100 parts H2O and H2O2 for each part NH4OH. In another embodiment, etching can be performed as a dry etch.

Figure 3:
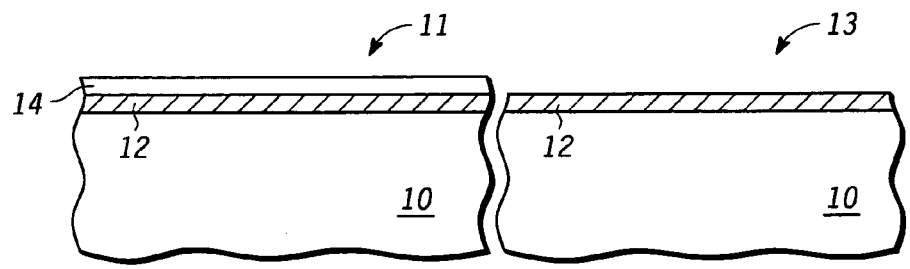
FIG. 3 includes an illustration of cross-sectional views of the portions of the substrate in FIG. 2 after removing a portion of a first layer of a gate electrode and the remaining portion of the hard mask layer.

After the exposed portion of the first layer 14 is removed, the remaining portion of the hard mask layer 16 within the PMOS portion 11 is removed, as illustrated in FIG. 3. The hard mask layer 16 may be removed by using a conventional etching process. The etching is performed such that the hard mask layer 16 is selectively removed as compared to the first layer 14 and the gate dielectric layer 12. In one embodiment, etching can be performed as a wet etch using a dilute HF solution. In one embodiment, the dilute HF solution has at least 10 parts H2O for each part HF, and in a particular embodiment, the dilute HF solution has at least 100 parts H2O for each part HF. In another embodiment, etching can be performed as a dry etch.

Figure 4:
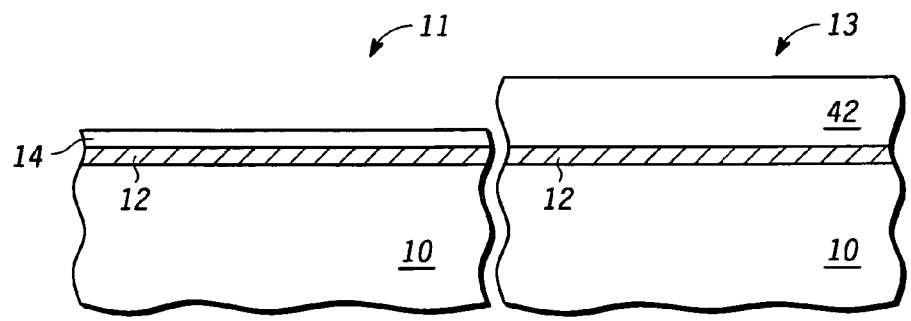
FIG. 4 includes an illustration of cross-sectional views of the portions of the substrate in FIG. 3 after adding a patterned mask layer.

FIG. 4 includes an illustration of cross-sectional views of the portions of the substrate in FIG. 3 after adding a patterned mask layer over a portion of the substrate 10 in accordance with one embodiment. A dopant mask 42 is formed over the gate dielectric layer 12 within the NMOS portion 13, as illustrated in FIG. 4. The dopant mask 42 can be formed using any one or more conventional techniques for forming a resist mask. In one embodiment, the process is substantially the same as described for the resist mask 18. The thickness of the dopant mask 42 is sufficient to substantially prevent a significant amount of ions from reaching the channel region directly under the gate dielectric layer 12 within the NMOS portion 13 during a subsequent ion implantation 44. In one embodiment, the dopant mask 42 includes a photoresist material and has a thickness in a range of approximately 100 to 1000 nm.

After the impurity has been introduced, the dopant mask 42 is removed. If the dopant mask includes a resist material, the dopant mask 42 can be removed using a conventional ashing technique. If the dopant mask 42 includes a hard mask layer, it will be removed selective to the gate dielectric layer 12 and the remaining portion of the first layer 14 within the PMOS portion 11. If desired, an optional anneal may be performed to anneal damage caused by the ion implantation. Additionally, the anneal can be used to drive dopants from the metal gate and/or the high-K dielectric layer into the channel. The optional anneal can be performed using an inert gas (e.g., $N_2$, a noble gas, or a combination thereof), at a temperature in a range of approximately 400 to 700° C. for a time in a range of approximately 0.5 to 2 minutes. In one embodiment, the concentration of the impurity within the first layer 14 can be less than 10 atomic %, and in a particular embodiment, less than 3 atomic %. After completing the steps illustrated in FIG. 4, processing continues with FIG. 7.

Figure 5:
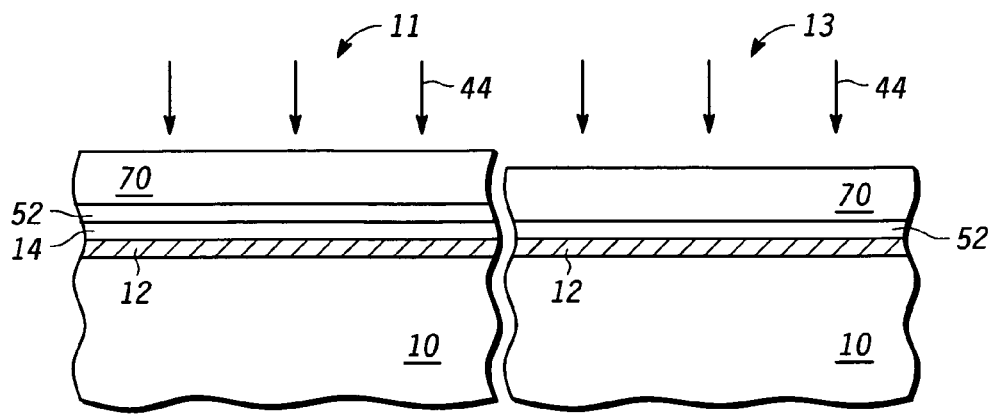
FIG. 5 includes an illustration of cross-sectional views of portions of the substrate during ion implantation according to another embodiment.

FIG. 5 includes an illustration of cross-sectional views of portions of the substrate during ion implantation in accordance with another embodiment. In FIG. 5, a second metal layer 52 is formed over the substrate 10. the second metal-containing gate layer 52 comprises at least one of TiN, TiAlN, TaAlN, TaN, TaSiN, TaSi, TaC, NiSi, $W_xN_y$, $Mo_xN_y$, $MoSi_xN_y$, $RuO_2$, $IrO_2$, MoSiO, MoSiON, MoHfO, MoHfO, MoHfON, and other transition metal containing materials. An amorphous silicon layer 70 is formed over the second metal layer 52. Note that layer 70 may also comprise polysilicon or may also comprise a dielectric material. The thickness of amorphous silicon layer 70 is used to determine the depth of ion implantation before or after annealing into the channel region of both portions 11 and 13 of substrate 10. The substrate 10 is then subjected to ion implantation 44. In the embodiment of FIG. 5, no masking layer is used and the ion implantation 44 is not selective to any particular portion.

Figure 6:
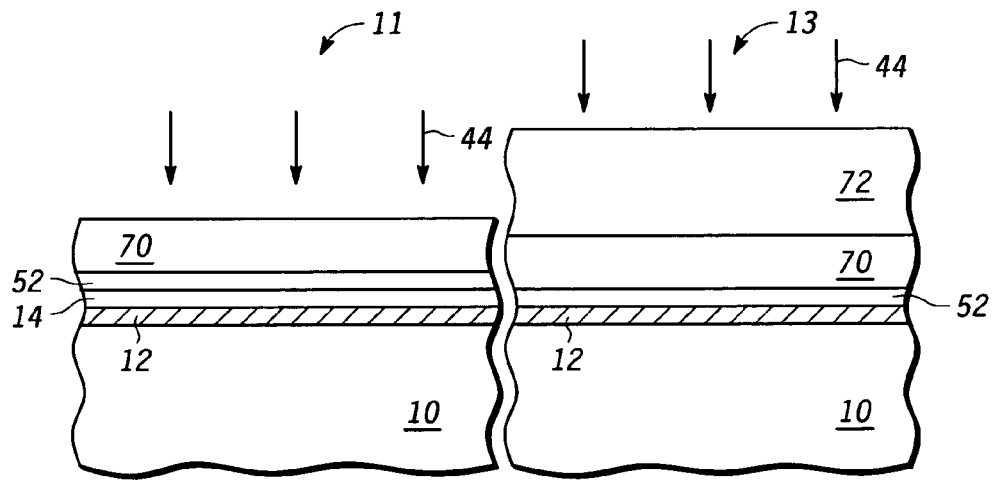
FIG. 6 includes an illustration of cross-sectional views of portions of the substrate during ion implantation according to an alternate embodiment.

FIG. 6 includes an illustration of cross-sectional views of portions of the substrate during ion implantation in another alternate embodiment. In FIG. 6, a second metal layer 52 is formed over the substrate 10 and an amorphous silicon layer 70 is formed over the second metal layer 52 as disclosed above for FIG. 5. In FIG. 6, a masking layer 72 is formed over substrate 10 and patterned to mask portion 13. The masking layer 72 can be a hard mask or photoresist. The substrate 10 is then subjected to ion implantation 44 which may then be annealed to drive the dopants into the channel region if required. The anneal may include furnace anneal, Rapid Thermal Anneal (RTA), laser anneal, or spike anneal. The masking layer 72 then prevents a significant amount of ions from reaching the layers below the masking layer 72. The channel region below gate dielectric layer 12 in portion 11 is counter-doped by the ion implantation 44 to adjust the VT of the channel region. The VT can be adjusted up or down depending of the type of dopant used. The masking layer 72 is then removed. The dopants introduced prior to forming the masking layer 72 comprise at least one of boron, $BF_2$, phosphorous, Aluminum, Gallium, Indium, Beryllium, Antimony, Calcium, and Arsenic.

Figure 7:
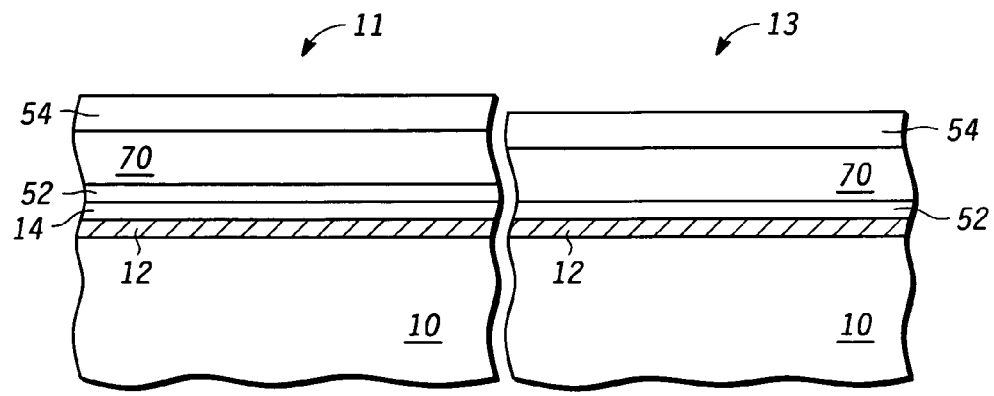
FIG. 7 includes an illustration of cross-sectional views of the portions of the substrate in FIG. 4 after forming the remaining layers of the gate electrode stacks in accordance with an embodiment.

FIG. 7 includes an illustration of cross-sectional views of the portions of the substrate in FIG. 4 after forming the remaining layers of the gate electrode stacks in accordance with an embodiment. In FIG. 7, a second layer 52 and a third layer 54 are then sequentially formed over the substrate 10 within the PMOS and NMOS portions 11 and 13. The second layer 52 determines the work function for the gate electrode being formed within the NMOS portion 13. For example, the second layer 52 can include TaC, TaSiN, TaN, TaSiC, HfC, NbC, TiC, NiSi, or any combination thereof. The third layer 54 includes one or more materials. In one embodiment, the third layer 54 includes heavily doped amorphous silicon or polycrystalline silicon, a metal silicide, or a combination thereof.

The layers 14, 52, 70, and 54 will be subjected to a temperature of 300° C. or higher during subsequent processing acts in forming the electronic device. One such act may include a source/drain anneal that may be performed at a temperature in a range of approximately 500-1100° C. In another embodiment, laser annealing may be performed at a temperature in a range of approximately 500 C to 1350° C. The actual materials selected for the layer 14, the layer 52, layer 70, and the layer 54 can depend on potential interactions that are to be avoided between layers that contact or are adjacent to each other, particularly at elevated temperatures (i.e., significantly above room temperature). After reading this specification, skilled artisans will be able to select proper materials for the layers 14, 52, 70, and 54 from a wide array of materials and still be able to avoid interactions that are undesired.

Figure 8:
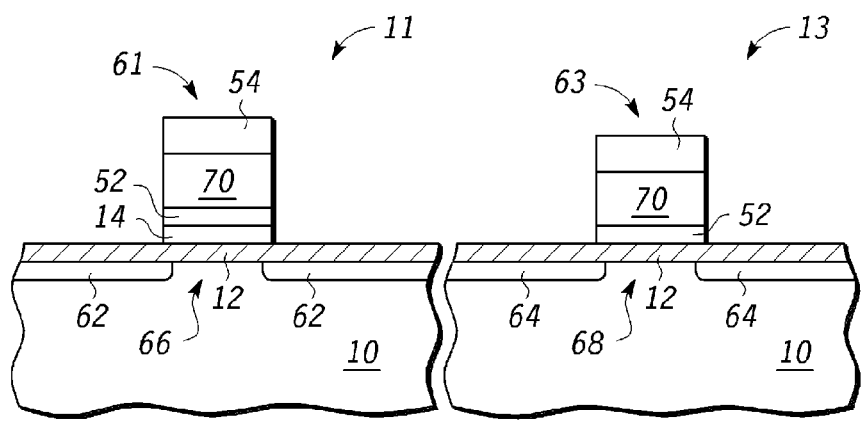
FIG. 8 includes an illustration of cross-sectional views of the portions of the substrate in FIG. 5 after forming gate electrodes and source/drain regions for transistors in accordance with an embodiment.

FIG. 8 includes an illustration of cross-sectional views of the portions of the Substrate in FIG. 5 after forming gate electrodes and source/drain regions for transistors in accordance with an embodiment. The layers within the gate stacks are patterned to form a gate electrode 61 within the PMOS portion 11 and a gate electrode 63 within the NMOS portion 13, as illustrated in FIG. 8. The patterning is performed using a conventional technique. The gate electrode 61 includes portions of the layers 14, 52, 70, and 54. The gate electrode 63 includes portions of the layers 52, 70, and 54. Ion implantation is performed to form P+ source/drain regions 62 within the PMOS portion 11, and N+ source/drain regions 64 within the NMOS portion 13. An anneal may be performed to activate the implanted dopants within the P+ and N+ source/drain regions 62 and 64. Channel regions 66 and 68 lie within the substrate 10 between the P+ and N+ source/drain regions 62 and 64. At this point in the process, a PMOS transistor and an NMOS transistor have been formed.

Although not illustrated, one or more insulating layers and one or more wiring layers are formed over the substrate 10. A passivation layer and an optional alpha particle protection layer (e.g., polyimide) are deposited to form a substantially completed electronic device. Such layers and their processes for formation are conventional to skilled artisans.

Many modifications can be made to the embodiments described above. For example, the metal layer 52 may be formed and patterned before forming the layer 14. In this embodiment, the hard mask layer 16 overlies the metal layer 52 and is used during the removal of the layer 52 from the PMOS portion 11 before the layer 14 is formed. In this embodiment, the layer 14 may be formed over the layer 52 before forming the layer 54. In another embodiment, a lithographic sequence can be performed to remove the portion of the layer 14 from the NMOS portion 13 before the layer 54 is formed. Along similar lines and referring to FIG. 7, the portion of the layer 52 within the PMOS portion 11 can be removed before forming the layer 54. Therefore, the layer 14 is not required within the NMOS portion 13, and the layer 52 is not required within the PMOS portion 11.

In still another embodiment, implantation can be performed through a sacrificial layer. For example, a sacrificial layer having a thickness of approximately 1 to 10 nm is deposited over the metal layer 14 within the PMOS portion 11, as illustrated in FIG. 3. After forming the dopant mask 42 and performing the implantation, the sacrificial layer can be removed. In one embodiment the sacrificial layer includes $SiO_2$, $Si_3N_4$, $SiO_xN_y$, or the like.

In yet another embodiment, the impurity may be incorporated using one or more dopant gases. Referring to, for example, FIG. 4, a gas including $B_2H_6$, $PH_3$, $POCl_3$, $AsH_3$, or the like may be exposed to the portion of the first layer 14 within the PMOS portion 11 and the dopant mask 42. If the gas exposure is performed at a temperature of approximately 50° C. or higher, the dopant mask may include an inorganic material, such as $SiO_2$, $Si_3N_4$, $SiO_xN_y$, or the like. An optional anneal may be performed to drive the dopants from the gate electrodes and/or the gate dielectric into the channel. The dopant mask 42 is removed using a conventional technique. Other processing activities are performed substantially the same as previously described.

In a further embodiment, an impurity can be introduced into the second layer 52 within the NMOS portion 13. Any one of the impurities and introduction methods as previously described with respect to the impurity for the first layer 14 may be used.

Figure 9:
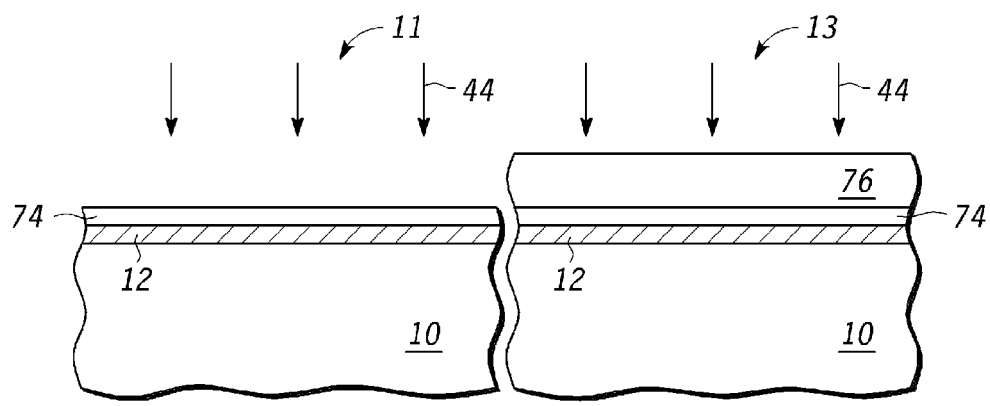
FIG. 9 includes an illustration of cross-sectional views of the portions of the substrate in a single-metal gate device after a masking layer is deposited and during ion implantation in accordance with an alternate embodiment.

FIG. 9 includes an illustration of cross-sectional views of the portions of the substrate 10 in a single-metal gate device after a masking layer is deposited and during ion implantation in accordance with an alternate embodiment. In FIG. 9, a single-metal gate electrode 74 is formed over the high-K gate dielectric 12. The single-metal gate electrode 74 forms the gate electrode for both portions 11 and 13. A masking layer 76 is formed over portion 13. The masking layer 76 prevents a significant portion of the ions from the subsequent ion implantation step from reaching the channel regions of portion 13. The portion 11 channel regions receive ions for adjusting the $V_T$ of the transistors formed in the portion 11.

Figure 10:
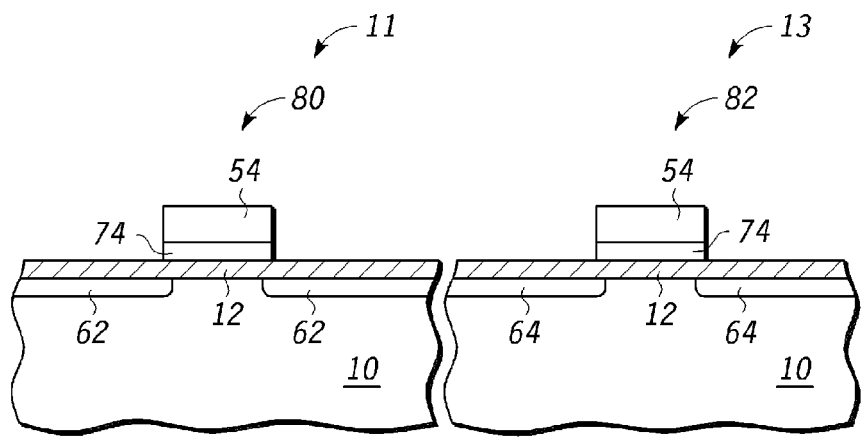
FIG. 10 includes an illustration of cross-sectional views of the portions of the substrate of FIG. 9 after forming gate electrodes and source/drain regions for transistors in accordance with an alternate embodiment.

FIG. 10 includes an illustration of cross-sectional views of the portions of the substrate of FIG. 9 after forming gate electrodes and source/drain regions for transistors in accordance with an alternate embodiment. The layers within the gate stacks are patterned to form a gate electrode 80 within the PMOS portion 11 and a gate electrode 82 within the NMOS portion 13, as illustrated in FIG. 10. The patterning is performed using a conventional technique. The gate electrode 80 includes portions of the layers 74 and 54. Likewise, the gate electrode 82 includes portions of the layers 74 and 54. As described above for FIG. 8, ion implantation is performed to form $P^+$ source/drain regions 62 within the PMOS portion 11, and $N^+$ source/drain regions 64 within the NMOS portion 13. An anneal may be performed to activate the implanted dopants within the $P^+$ and $N^+$ source/drain regions 62 and 64. The channel regions 66 and 68 lie within the substrate 10 between the $P^+$ and $N^+$ source/drain regions 62 and 64. At this point in the process, a PMOS transistor and an NMOS transistor have been formed.

Although not illustrated, one or more insulating layers and one or more wiring layers are formed over the substrate 10. A passivation layer and an optional alpha particle protection layer (e.g., polyimide) are deposited to form a substantially completed electronic device. Such layers and their processes for formation are conventional to skilled artisans. After processing of the electronic device is substantially completed, the concentration of the impurity that was introduced into the first layer 14 (in FIG. 4) is greater than the concentration of the same impurity within the channel region 66.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that one or more modifications or one or more other changes can be made without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

What is claimed is:

1. A method of making a semiconductor device, comprising:

providing a first substrate region and a second substrate region, wherein at least a part of the first substrate region has a first conductivity type and at least a part of the second substrate region has a second conductivity type different from the first conductivity type;

forming a dielectric layer over at least a portion of the first substrate region and at least a portion of the second substrate region;

forming a first metal-containing gate layer over at least a portion of the dielectric layer overlying the first substrate region;

forming a second metal-containing gate layer over at least a portion of the dielectric layer, over at least a portion of the first metal-containing gate layer, and over at least a portion of the first substrate region;

forming an amorphous silicon layer over the second metal-containing gate layer;

introducing dopants into at least a portion of the first substrate region through at least the first metal-containing gate layer, the second metal-containing gate layer, and the amorphous silicon layer; and patterning the dielectric layer, the first and second metal-containing gate layers, and the amorphous silicon layer to form a gate stack over the first substrate region.

2. The method of claim 1, wherein the first conductivity type is p-type and the second conductivity type is n-type.

3. The method of claim 1 further comprising performing an anneal operation on the semiconductor device.

4. The method of claim 1, wherein introducing the dopants into the at least the portion of the first substrate region comprises implanting the dopants.

5. The method of claim 1, wherein introducing the dopants into the at least the portion of the first substrate region comprises annealing at least the first metal- containing gate layer.

6. The method of claim 1, wherein the dielectric layer comprises at least one of $HfO_xN_y$, $HfSi_xO_y$, $HfSi_xO_yN_z$, $HfZr_xO_yN_z$, $HfZr_xSi_yO_zN_q$, $HfZrO$, $ZrSi_xO_y$, $ZrSi_xO_yN_z$, $ZrO_2$, and other Hf-containing or Zr-containing dielectric materials.

7. The method of claim 3 further comprising forming a mask over the amorphous silicon layer overlying the second substrate region prior to introducing the dopants into the at least the portion of the first substrate region.

8. The method of claim 1, wherein the dopants comprise at least one of boron, $BF_2$, phosphorous, Aluminum, Gallium, Indium, Beryllium, Antimony, Calcium, and Arsenic.

9. The method of claim 1, wherein an introduction of the dopants into the at least the portion of the first substrate region lowers a threshold voltage of a channel region of a transistor formed in the first substrate region.

10. The method of claim 1, wherein each of the first metal-containing gate layer and the second metal-containing gate layer comprises at least one of TiN, TiAlN, TaAlN, TaN, TaSiN, TaSi, TaC, NiSi, $W_xN_y$, $Mo_xN_y$, $MoSi_xN_y$, $RuO_2$, $IrO_2$, MoSiO, MoSiON, MoHfO, MoHfON, and other transition metal containing materials.

11. A method of making a semiconductor device, comprising:

providing a first substrate region and a second substrate region, wherein at least a part of the first substrate region has a first conductivity type and at least a part of the second substrate region has a second conductivity type different from the first conductivity type;

forming a dielectric layer over at least a portion of the first substrate region and at least a portion of the second substrate region;

forming a first metal-containing gate layer over at least a portion of the dielectric layer overlying the first substrate region;

forming a second metal-containing gate layer over at least a portion of the dielectric layer, over at least a portion of the first metal-containing gate layer, and over at least a portion of the first substrate region;

forming an amorphous silicon layer over the second metal-containing gate layer;

performing an ion implantation to introduce a dopant into at least a portion of the first substrate region through at least the first metal-containing gate layer, the second metal-containing gate layer, and the amorphous silicon layer;

performing an anneal operation on the semiconductor device to drive the dopant into the first substrate region; and forming a gate stack over the first substrate region, the gate stack including a portion of the dielectric layer, a portion of the first and second metal-containing gate layers, and a portion of the amorphous silicon layer.

12. A method of making a semiconductor device, comprising:

providing a first substrate region and a second substrate region, wherein at least a part of the first substrate region has a first conductivity type and at least a part of the second substrate region has a second conductivity type different from the first conductivity type;

forming a dielectric layer over at least a portion of the first substrate region and at least a portion of the second substrate region;

forming a first metal-containing gate layer over at least a portion of the dielectric layer;

forming a second metal-containing gate layer over at least a portion of the dielectric layer, over at least a portion of the first metal-containing gate layer, and over at least a portion of the first substrate region;

forming an amorphous silicon layer over the second metal-containing gate layer;

implanting a dopant into at least a portion of the first substrate region through at least the first metal-containing gate layer, the second metal-containing gate layer, and the amorphous silicon layer;

annealing the semiconductor device to drive the dopant into the first substrate region; and forming a gate stack over the first substrate region, the gate stack including a portion of the dielectric layer, a portion of the first and second metal-containing gate layers, and a portion of the amorphous silicon layer.

13. The method of claim 12, wherein the first conductivity type is n-type and the second conductivity type is p-type.

14. The method of claim 12, wherein the dielectric layer comprises at least one of $HfO_xN_y$, $HfSi_xO_y$, $HfSi_xO_yN_z$, $HfZr_xO_yN_z$, $HfZr_xSi_yO_zN_q$, $HfZrO$, $ZrSi_xO_y$, $ZrSi_xO_yN_z$, $ZrO_2$, and other Hf-containing or Zr-containing dielectric materials.

15. The method of claim 12, wherein the first metal-containing layer comprises at least one of TiN, TiAlN, TaAlN, TaN, TaSiN, TaSi, TaC, NiSi, $W_xN_y$, $Mo_xN_y$, $MoSi_xN_y$, $RuO_2$, $IrO_2$, MoSiO, MoSiON, MoHfO, MoHfON, and other transition metal containing materials.

16. The method of claim 12, wherein the dopant comprises at least one of boron, $BF_2$, phosphorous, Aluminum, Gallium, Indium, Beryllium, Antimony, Calcium, and Arsenic.

17. The method of claim 12, wherein the dopant lowers a threshold voltage of a channel region of a transistor formed in the first substrate region.

* * * * *